United States Patent
Chung et al.

(10) Patent No.: US 7,842,581 B2
(45) Date of Patent: Nov. 30, 2010

(54) METHODS OF FORMING METAL LAYERS USING OXYGEN GAS AS A REACTION SOURCE AND METHODS OF FABRICATING CAPACITORS USING SUCH METAL LAYERS

(75) Inventors: Suk-Jin Chung, Gyeonggi-do (KR); Jin-Yong Kim, Seoul (KR); Wan-Don Kim, Gyeonggi-do (KR); Kwang-Hee Lee, Seoul (KR); Cha-Young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 294 days.

(21) Appl. No.: 11/616,406

(22) Filed: Dec. 27, 2006

(65) Prior Publication Data

US 2007/0167006 A1    Jul. 19, 2007

Related U.S. Application Data

(63) Continuation-in-part of application No. 10/801,208, filed on Mar. 16, 2004.

(30) Foreign Application Priority Data

Mar. 27, 2003  (KR) .................... 2003-19258
Dec. 28, 2005  (KR) .................... 10-2005-0131890

(51) Int. Cl.
*H01L 21/20*   (2006.01)

(52) U.S. Cl. .................... 438/399; 438/680; 438/763; 257/E21.011

(58) Field of Classification Search ................ 438/387, 438/393, 396, 399, 605, 627, 628, 652, 686, 438/239, 243, 250, 253, 386, 687, 761, 678, 438/680, 763; 257/E21.008, E21.011, E21.021, 257/E21.294, E21.295, E21.476, E21.477, 257/E21.478, E21.016, E21.019, E21.171, 257/E21.647, E21.648
See application file for complete search history.

(56) References Cited

U.S. PATENT DOCUMENTS 6,421,223 B2 *   7/2002   Marsh .................... 361/306.3

(Continued)

FOREIGN PATENT DOCUMENTS

KR   2002045269 A  *  6/2002

(Continued)

OTHER PUBLICATIONS

Office Action from corresponding U.S. Appl. No. 10/801,208, Mailed Dec. 23, 2009.

*Primary Examiner*—Matthew C Landau
*Assistant Examiner*—Joseph C Nicely
(74) *Attorney, Agent, or Firm*—Myers Bigel Sibley & Sajovec

(57) ABSTRACT

When a metal layer formed by reaction of a metal source and an oxygen ($O_2$) source is deposited, oxidization of a conductive layer disposed under or on the metal layer can be reduced and/or prevented by a method of forming the metal layer and a method of fabricating a capacitor using the same. Between forming the conductive layer and the metal layer, and between forming the metal layer and the conductive layer, a cycle of supplying a metal source, purging, supplying an oxygen source, purging, plasma processing of reduction gas and purging is repeated at least once. In this case, the metal layer is formed by repeating a cycle of supplying a metal source, purging, supplying an oxygen source and purging.

11 Claims, 8 Drawing Sheets

U.S. PATENT DOCUMENTS

| | | | |
|---|---|---|---|
| 6,462,367 B2 * | 10/2002 | Marsh et al. | 257/295 |
| 6,656,784 B2 | 12/2003 | Pakr | 438/239 |
| 6,677,217 B2 * | 1/2004 | Joo et al. | 438/398 |
| 6,713,373 B1 * | 3/2004 | Omstead | 438/608 |
| 6,737,313 B1 * | 5/2004 | Marsh et al. | 438/240 |
| 6,756,261 B2 | 6/2004 | Hong | |
| 6,777,305 B2 * | 8/2004 | Lee et al. | 438/396 |
| 7,049,191 B1 * | 5/2006 | Agarwal | 438/238 |
| 7,107,998 B2 * | 9/2006 | Greer et al. | 134/22.1 |
| 7,259,058 B2 * | 8/2007 | Shimamoto et al. | 438/240 |
| 2002/0001860 A1 | 1/2002 | Kweon et al. | 438/3 |
| 2002/0025694 A1 * | 2/2002 | Agarwal | 438/798 |
| 2002/0086480 A1 | 7/2002 | Kim et al. | |
| 2003/0017669 A1 | 1/2003 | Kiyotoshi et al. | |
| 2003/0020122 A1 | 1/2003 | Joo et al. | |
| 2003/0124812 A1 * | 7/2003 | Ahn et al. | 438/396 |
| 2003/0190808 A1 * | 10/2003 | Kim et al. | 438/689 |
| 2004/0087178 A1 | 5/2004 | Koyanagi et al. | |
| 2004/0175845 A1 * | 9/2004 | Molla et al. | 438/3 |
| 2004/0214354 A1 * | 10/2004 | Marsh et al. | 438/3 |
| 2004/0217410 A1 * | 11/2004 | Meng et al. | 257/310 |
| 2004/0241321 A1 * | 12/2004 | Ganguli et al. | 427/255.28 |
| 2005/0020060 A1 * | 1/2005 | Aaltonen et al. | 438/650 |
| 2005/0048776 A1 * | 3/2005 | Papa Rao et al. | 438/687 |
| 2005/0118807 A1 * | 6/2005 | Kim et al. | 438/686 |
| 2005/0124154 A1 * | 6/2005 | Park et al. | 438/643 |
| 2008/0124945 A1 * | 5/2008 | Miya et al. | 438/778 |
| 2008/0251828 A1 * | 10/2008 | Meng et al. | 257/304 |
| 2009/0004850 A1 * | 1/2009 | Ganguli et al. | 438/655 |
| 2009/0011150 A1 * | 1/2009 | Jeon et al. | 427/579 |
| 2009/0011595 A1 * | 1/2009 | Seo et al. | 438/680 |
| 2009/0032857 A1 * | 2/2009 | Takeuchi | 257/308 |

FOREIGN PATENT DOCUMENTS

| | | |
|---|---|---|
| KR | 20020074922 | 10/2002 |
| KR | 20020034715 A | 12/2002 |
| KR | 1020010032687 A | 12/2002 |
| KR | 1020030002128 A | 1/2003 |
| KR | 20040059775 | 7/2004 |
| KR | 1020030019258 A | 10/2004 |

* cited by examiner

METHODS OF FORMING METAL LAYERS USING OXYGEN GAS AS A REACTION SOURCE AND METHODS OF FABRICATING CAPACITORS USING SUCH METAL LAYERS

CROSS-REFERENCE TO RELATED PATENT APPLICATIONS

This application claims the benefit under 35 U.S.C. §119 of Korean Patent Application No. 10-2005-0131890, filed on Dec. 28, 2005, in the Korean Intellectual Property Office, and further claims priority under 35 U.S.C. §120 as a continuation-in-part application of U.S. patent application Ser. No. 10/801,208, filed on Mar. 16, 2004 in the U.S. Patent and Trademark Office, which U.S. application in turn claims the benefit under 35 U.S.C. §119 of Korean Patent Application No. 2003-19258, filed Mar. 17, 2003, in the Korean Intellectual Property Office. The disclosures of each of the above applications is incorporated herein in its entirety by reference.

FIELD OF THE INVENTION

The present invention relates to methods of forming semiconductor devices and, more particularly, to methods of forming semiconductor metal layers and semiconductor capacitors using such metal layers

BACKGROUND OF THE INVENTION

Metal oxide layers (hereinafter referred to as "high dielectric films") such as $Ta_2O_5$ or BST (($Ba,Sr)TiO_3$) are commonly used as capacitor dielectric films of highly integrated semiconductor memory devices. These high dielectric films have an excellent dielectric property, but may also exhibit relatively high leakage currents. One way to decrease the leakage current of a high dielectric film capacitor is to form the electrode(s) of the capacitor of metal layers such as Pt, Ru, Ir, Rh, Os, Pr and/or SRO that have a work function that is greater than the work function of the polysilicon layers that are conventionally used as capacitor electrodes. Most of the metals are formed by reaction of a metal source and an oxygen source, which may be formed by Atomic Layer Deposition (ALD) or Chemical Vapor Deposition (CVD).

SUMMARY

Pursuant to embodiments of the present invention, methods of forming metal layers on a conductive layer are provided which may reduce and/or minimize oxidation of the conductive layer when the metal layer is formed by reaction of a metal source and an oxygen source. Further embodiments of the present invention provide methods of fabricating capacitors that provide a low resistance contact between the capacitor and a contact plug.

Pursuant to certain embodiments of the present invention, methods of forming a first metal layer on a growth surface are provided, where the first metal layer has a surface that contacts a conductive layer. Pursuant to these methods, a cycle of supplying a metal source to the growth surface, and then purging, and then supplying an oxygen source to the growth surface, and then purging, and then plasma processing in a reduction gas ambient, and then purging is repeated at least once. In some embodiments, a second metal layer may be formed in contact with the first metal layer by repeating a cycle of supplying the metal source, and then purging, and then supplying the oxygen source, and then purging. The first metal layer and the second metal layer may comprise the same metal. Moreover, the plasma processing in a reduction gas environment may involve plasma processing in an $NH_3$ gas or an $H_2$ gas ambient.

Pursuant to further embodiments of the present invention, methods of forming a metal layer having a lower surface contacting a conductive layer and formed by reaction of a metal source and an oxygen source are provided. Pursuant to these methods, a first metal layer is formed by repeating at least once a deposition cycle of supplying a metal source, and then purging, and then supplying an oxygen source, and then plasma processing in a reduction gas ambient, and then purging. Then, a second metal layer is formed on an upper surface of the first metal layer by repeating a plurality of times a deposition cycle of supplying the metal source, and then purging, and then supplying the oxygen source, and then purging. In these methods, the plasma processing in a reduction gas ambient may comprise plasma processing performed in an $NH_3$ gas or an $H_2$ gas ambient, and the first and second metal layers may comprise the same metal. In specific embodiments, the first and second metal layers may comprise a material selected from a group consisting of Ru, Pt, Pr, Ir, SRO and Cu. The number of the deposition cycles to form the first metal layer may be about the minimum number of deposition cycles necessary to form a coating on the conductive layer. Moreover, the second metal layer may be thicker than the first metal layer.

Pursuant to still further embodiments of the present invention, methods of fabricating capacitors are provided. Pursuant to these methods, an interlayer insulating layer is formed on a semiconductor substrate. A contact plug is formed that penetrates the interlayer insulating layer. A metal layer is formed on the contact plug by performing a deposition cycle that includes at least one cycle of supplying a metal source, and then purging, and then supplying an oxygen source, and then purging, and then plasma processing in a reduction gas ambient, and then purging. Finally, a portion of the metal layer is removed to form a lower electrode.

In these methods, the deposition cycle may further include at least one cycle of supplying a metal source, and then purging, and then supplying an oxygen source, and then purging. The metal source in these methods may be selected from a group consisting of a Ru source, a Pt source, a Pr source, an Ir source, a SRO source and a Cu source. The reduction gas may be an $NH_3$ gas or an $H_2$ gas. The methods may also include forming a mold oxide layer that includes a lower electrode region that exposes the contact plug before forming the metal layer. In such embodiments, the lower electrode may be formed by chemical mechanical polishing the metal layer to expose a surface of the mold oxide layer and then removing the mold oxide layer. These methods may also involve forming a dielectric film on a surface of the lower electrode, forming an upper electrode on an upper surface of the dielectric film and forming a metal interconnect in direct contact with the upper electrode. This upper electrode may be formed by forming a third metal layer on an upper surface of the dielectric film by repeating a cycle of supplying a metal source, and then purging, and then supplying an oxygen source, and then purging; and then forming a fourth metal layer on an upper surface of the third metal layer by repeating a cycle of supplying the metal source, and then purging, and then supplying the oxygen source, and then purging, and then plasma processing in a reduction gas ambient and then purging.

Pursuant to still further embodiments of the present invention, methods of forming a metal layer directly on a conductive layer in a chamber are provided in which a metal via is deposited via atomic layer deposition on the conductive layer, then the chamber is purged, then oxygen is deposited via atomic layer deposition on the conductive layer, and then the chamber is again purged, and then the conductive layer with the metal and oxygen is subjected to plasma processing in a reduction gas ambient; and then the chamber is again purged. These methods may be repeated a plurality of times to form the metal layer directly on the conductive layer. The metal layer may comprise a seed layer, and a main metal layer may be formed by atomic layer deposition on the seed layer. In such embodiments, the main metal layer may be formed by depositing the metal via atomic layer deposition on the seed layer, and then purging the chamber, and then depositing oxygen via atomic layer deposition on the seed layer, and then purging the chamber. The conductive layer may comprise a contact plug of a semiconductor device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
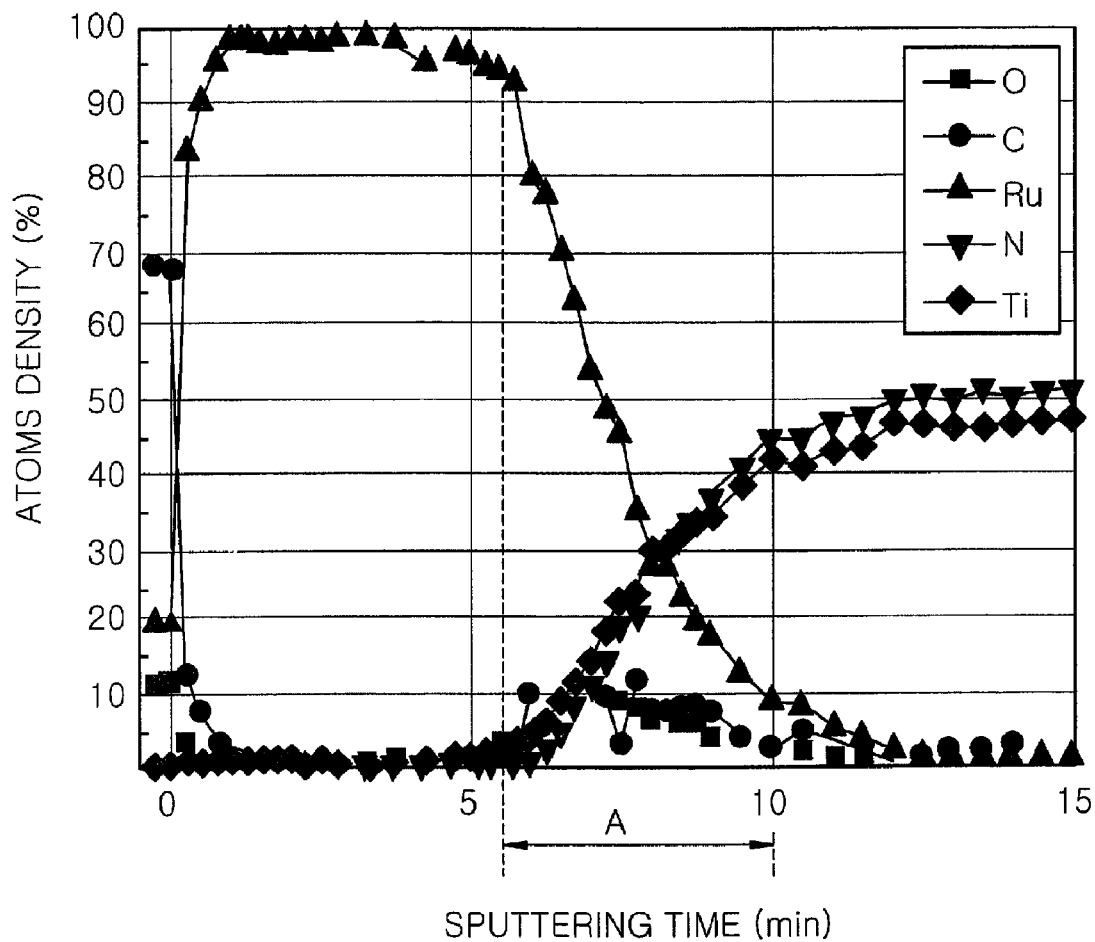
FIG. 1 is a graph illustrating analyzed ingredients of a conventional Ru lower electrode and TiN contact plug.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-sectional illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

When metal layers are formed by reaction of a metal source and an oxygen source on a conductive layer, the oxygen atoms may tend to concentrate at the interfacial surface of the metal layer and the conductive layer, and thus tend to oxidize the conductive layer. As one example, when a capacitor lower electrode is composed of a metal layer formed by reaction of a metal source and an oxygen source, and a contact plug is disposed under the capacitor lower electrode, oxygen atoms may gather on a contact surface of the contact plug. As a result, the contact plug may be oxidized.

FIG. 1 is a graph showing the ingredients of a TiN contact plug and a Ru lower electrode formed thereon. In FIG. 1, the x-axis denotes the analysis time, and the y-axis denotes the atom density (%). The analysis time corresponds to the thicknesses of the lower electrode and the contact plug.

As shown in FIG. 1, the density of oxygen atoms is very low in the region corresponding to a sputtering time of 0 to about 5.5 minutes, which corresponds to the Ru electrode. However, in the region designated "A", which corresponds to a sputtering time of about 5.5 to about 10 minutes, the number of oxygen atoms increases significantly. As can be seen in FIG. 1 from the simultaneous distribution of both Ru atoms and Ti atoms, the region "A" corresponds to an interfacial surface of the Ru electrode and the TiN contact plug.

As described above, the oxygen atoms concentrated on the interfacial surface of the Ru electrode and the TiN plug may oxidize a surface of the TiN plug with an excellent oxidization characteristic. As a result, the contact resistance between the lower electrode and the plug may be increased. Moreover, a parasitic capacitance may arise between the lower electrode and the contact plug which may decrease the overall capacitance of the device.

Figure 2:
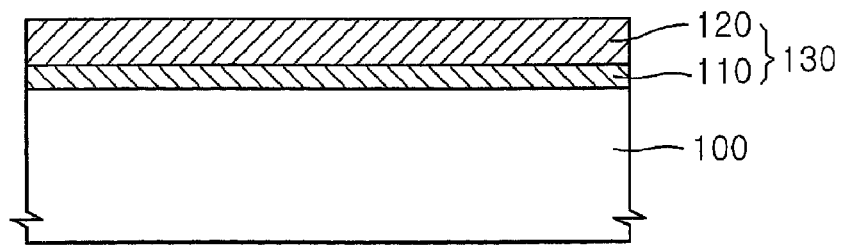
FIG. 2 is a cross-sectional diagram illustrating methods of forming metal layers according to embodiments of the present invention.

FIG. 2 is a cross-sectional diagram illustrating methods of forming metal layers according to embodiments of the present invention. As shown in FIG. 2, a metal layer 130 is formed on a semiconductor substrate 100. The metal layer 130 is formed by reaction of a metal source and an oxygen source. The metal layer 130 includes a first metal layer 110 that acts as a seed layer, and a second metal layer 120 that acts as a main layer. The first and second metal layers 110 and 120 may be obtained by supplying the same metal source and the same oxygen source, and may be formed by Atomic Layer Deposition (ALD). A conductive layer (not shown) may be interposed between the first metal layer 110 and the semiconductor substrate 100.

Figure 3A:
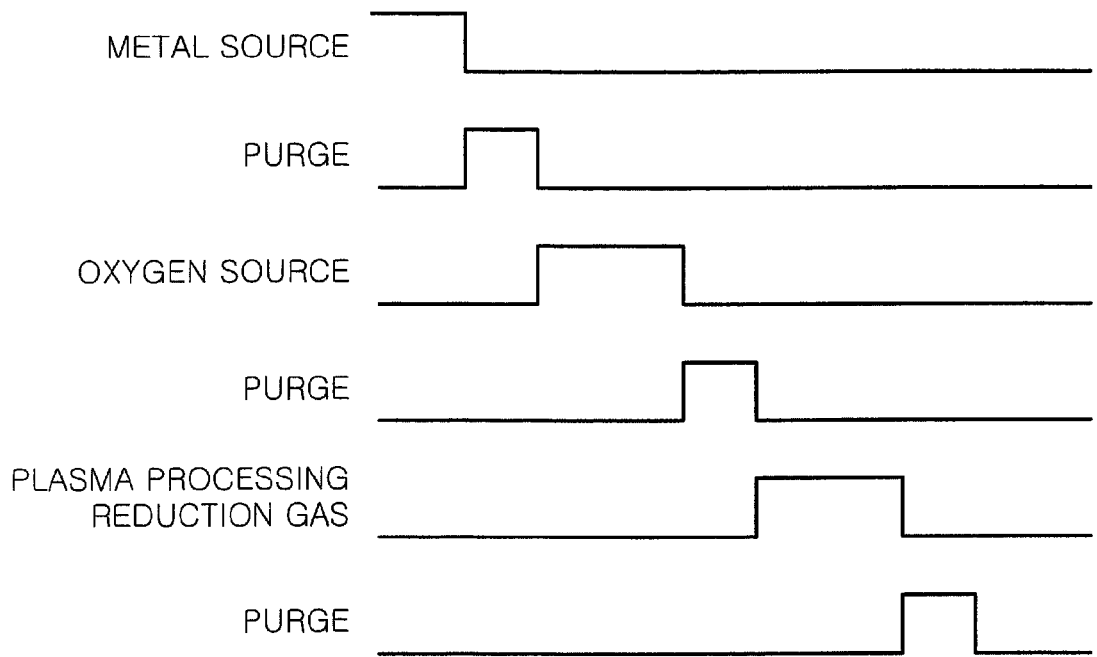
FIG. 3A is a series of timing charts illustrating a deposition cycle of the first metal layer shown in FIG. 2.

As shown in FIG. 3A, the first metal layer 110 may be formed by performing at least one cycle consisting of supplying a metal source, purging, supplying an oxygen source, purging, plasma processing in a reduction gas ambient, and purging. If the metal source is supplied as described above, metal atoms are chemically absorbed in the surface of the semiconductor substrate 100 (or conductive layer), and any remaining atoms (i.e., atoms exclusive of the chemically absorbed metal atoms) are removed by purging. Then, by supplying the oxygen source, the chemically absorbed metal atoms and the oxygen atoms are chemically and physically absorbed, and the oxygen atoms physically absorbed in the purging and the other ingredients are eliminated. Thereafter, when plasma processing is performed in the reduction gas ambient, bonding of the oxygen atoms chemically absorbed in the semiconductor substrate (or conductive layer) and the metal atoms is broken, and the dissolved oxygen atoms are discharged out of the chamber by purging. Accordingly, the oxygen content in the first metal layer 110 may be greatly decreased. In this case, the reduction gas may include a hydrogen ingredient, e.g., $H_2$ or $NH_3$ gas. Also, by plasma processing, efficiency of eliminating the oxygen atoms can be increased within a short time period.

As described above, when plasma processing is performed in the reduction gas ambient, the oxygen atoms in the interfacial surface of the conductive layer and the first metal layer 110 can be significantly decreased. As a result, oxidation of the conductive layer may be reduced and/or minimized, and thus the contact resistance between the conductive layer and the first metal layer 110 can be decreased.

Figure 3B:
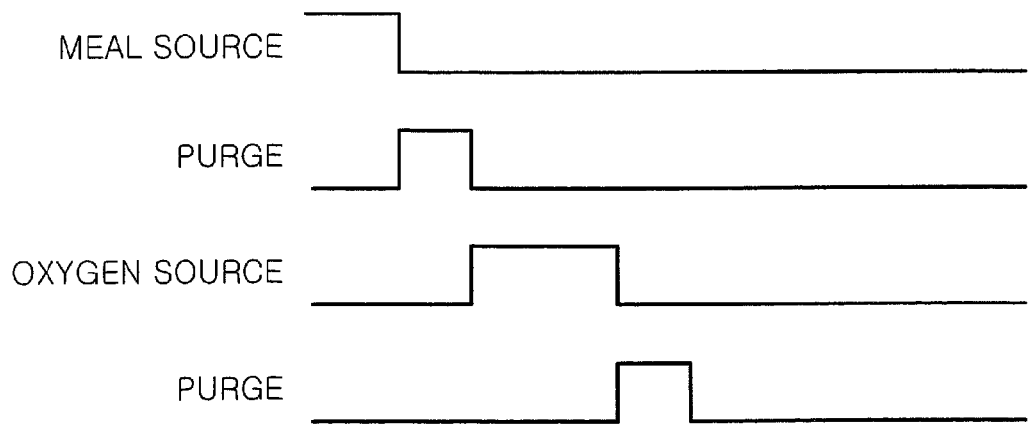
FIG. 3B is a series of timing charts illustrating a deposition cycle of the second metal layer shown in FIG. 2.

The first metal layer 110 may be just thick enough to form a coating, and may, for example, have a thickness of ⅓~⅙ of the total thickness of the metal layer 130. The second metal layer 120 may also be formed by ALD. The second metal layer 120 is thicker than the first metal layer 110. The second metal layer 120, as shown in FIG. 3B, may be formed by repeating a series of processing steps consisting of supplying a metal source, purging, supplying an oxygen source, and purging, at least once.

In forming the second metal layer 120, the step of plasma processing in the reduction gas ambient is not included. The plasma processing can remove oxygen within the thin film, but also may slow the speed at which the metal layer is deposited. Therefore, the second metal layer 120, which is the relatively thicker main layer, may be formed without performing plasma processing in order to increase the speed at which the second metal layer 120 is deposited. Even though the second metal layer 120 is formed without reduction gas plasma processing, the first metal layer 110 may maintain a good conductive characteristic.

As described above, the first metal layer 110 which is adjacent to the semiconductor substrate 100 (and/or the conductive layer) is subjected to plasma processing in the reduction gas ambient, so that most oxygen atoms within the first metal layer 110 are removed. Then, the second metal layer 120 is formed on the upper surface of the first metal layer 110 without plasma processing. By doing so, the density of oxygen atoms at the interfacial surface of the semiconductor substrate 100 (or conductive layer) and the first metal layer 110 can be reduced and/or minimized. Moreover, an overall deposition speed of the metal layer 130 can be improved.

Figure 4:
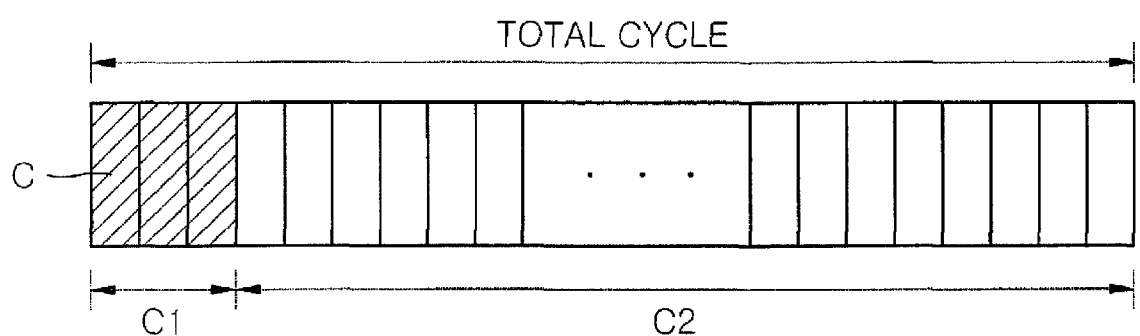
FIG. 4 is a view illustrating a cycle distribution of the metal layer according to embodiments of the present invention.

Referring to FIG. 4, the metal layer 130 may be formed by ALD, and obtained by repeating a deposition cycle C a plurality of times. In this case, a total deposition cycle to form the metal layer 130 may be arbitrarily classified into an initial cycle group C1 (once~$n^{th}$ time) and a post cycle group C2 ($n+1^{th}$ time~final time). The initial cycle group C1 and the post cycle C2 may be performed in different ways. In particular, the initial cycle group C1 may comprise cycles C in which a metal source is supplied, a purge is performed, an oxygen source is supplied, a purge is performed, plasma processing in a reduction gas ambient is performed, followed by a purge, as shown in FIG. 3A. Accordingly, most of the oxygen atoms in the metal layer that is formed by the initial cycle C1 are removed by plasma processing in the reduction gas ambient as described above.

In contrast, the cycles C of the post deposition cycle group C2 may comprise supplying a metal source, purging, supplying an oxygen source and purging, as shown in FIG. 3B. In this manner, the deposition speed of the metal layer portion can be increased. The number of cycles C in the initial cycle C1 may be a relatively small number of cycles that forms a thin coating on the semiconductor substrate 100 (and/or on a conductive layer).

Figure 5A:
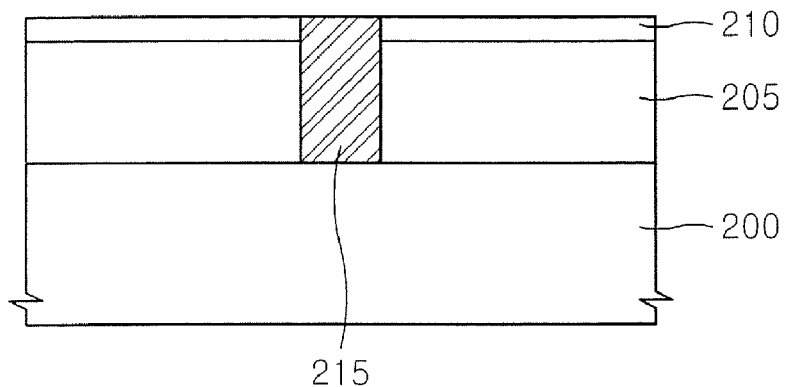
FIGS. 5A through 5D are cross-sectional diagrams illustrating methods of fabricating capacitors according to further embodiments of the present invention.

FIGS. 5A through 5D are cross-sectional diagrams illustrating methods of fabricating capacitors according to further embodiments of the present invention. As shown in FIG. 5A, a semiconductor substrate 200 is prepared. The semiconductor substrate 200 may comprise, for example, a silicon substrate. A MOS transistor (not shown), a contact pad (not shown), an insulating layer (not shown), and so on may be provided on the semiconductor substrate 200. An interlayer insulating layer 205 and an etch stop layer 210 are sequentially formed on the semiconductor substrate 200. As is well known in the art, the interlayer insulating layer 205 may include a planarization layer composed of, for example, silicon oxide. The etch stop layer 210 may comprise a silicon nitride layer so as to have etch selectivity with respect to the interlayer insulating layer 205. Predetermined portions of the etch stop layer 210 and the interlayer insulating layer 205 are etched to form a contact hole. Then, a conductive layer such as, for example, a TiN layer, is deposited in the contact hole, thereby forming a contact plug 215.

Figure 5B:
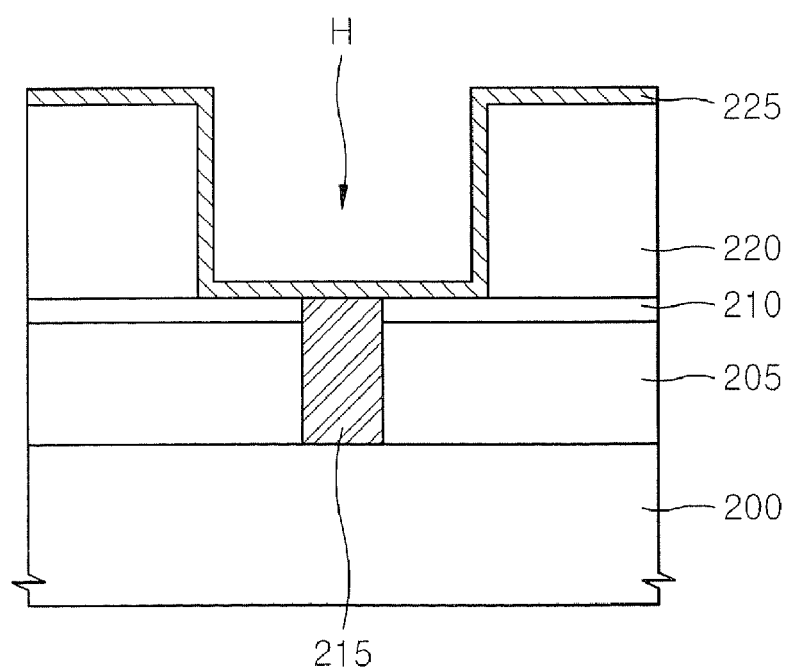

Referring to FIG. 5B, a mold oxide layer 220 is formed on an upper surface of the etch stop layer 210 and the TiN contact plug 215. Thereafter, a predetermined portion of the mold oxide layer 220 is etched to expose the contact plug 215 to define a lower electrode region H. Then, a first Ru thin film 225 is deposited to contact the exposed contact plug 215.

Figure 6A:
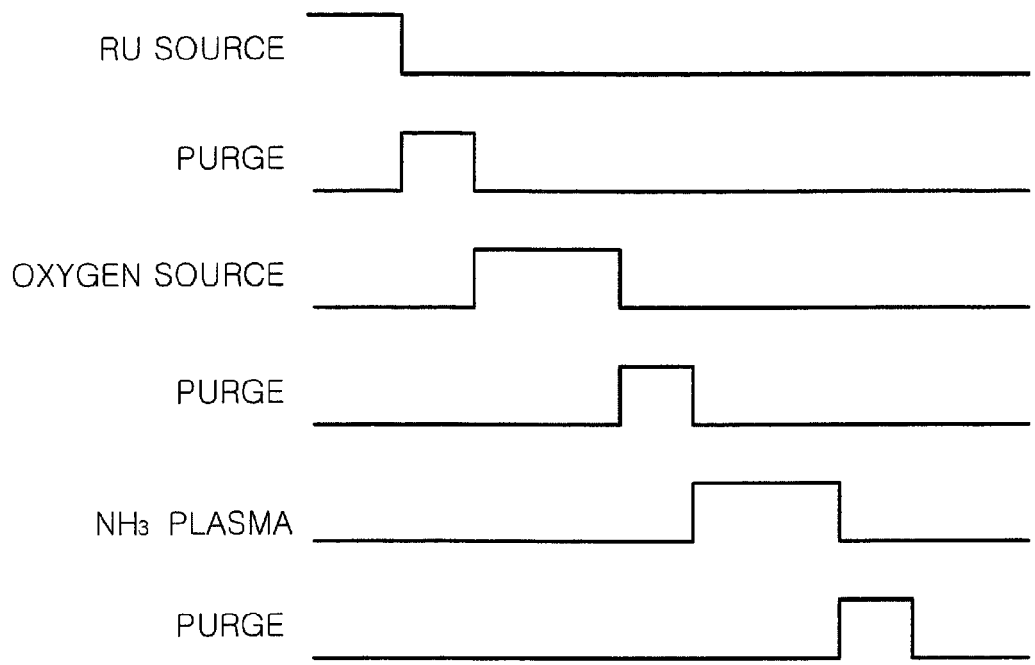
FIG. 6A is a series of timing charts illustrating a deposition cycle of the first Ru thin film shown in FIG. 5B.

As shown in FIG. 6A, the first Ru thin film 225 may be formed by performing at least one cycle that includes supplying a Ru source for a predetermined time by ALD, purging, supplying and oxygen source, purging, plasma processing in $NH_3$ and purging. Here, the first Ru thin film 225 comprises a seed layer of a Ru lower electrode.

The forming of the first Ru thin film 225 will now be described in more detail. As shown in step (a) of FIG. 7, Ru atoms are chemically and physically absorbed on the contact plug 215 when the Ru source is supplied. Then, purging is carried out to remove the Ru atoms and other ingredients physically absorbed on the surface of the contact plug 215.

Figure 7:
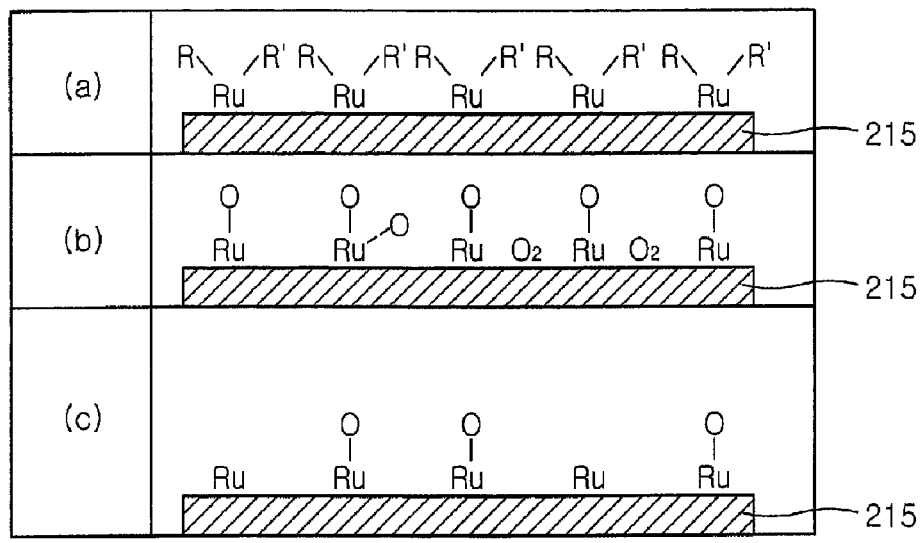
FIG. 7 illustrates deposition of the first Ru thin film shown in FIG. 5B.

As shown in step (b) of FIG. 7, once the oxygen source is supplied, oxygen atoms and Ru atoms are chemically and physically absorbed. Then, purging is performed to remove the oxygen atoms that are not chemically absorbed. Then, the oxygen atoms are bonded to the Ru atoms chemically absorbed on the surface of the contact plug 215, and the oxygen atoms are partially absorbed on the interfacial surface of the contact plug 215.

As shown in step (c) of FIG. 7, plasma processing of $NH_3$ is performed for a predetermined time. Then, $H_2$ gas, i.e., the reduction gas, is in a plasma state to be bonded to the oxygen atoms placed on the interfacial surface of the contact plug 215 and the oxygen atoms chemically absorbed to the Ru atoms. Thereafter, the oxygen atoms bonded to $H_3$ gas are eliminated by purging. By the foregoing $NH_3$ plasma processing, almost all oxygen atoms chemically absorbed in the interfacial surface of the contact plug 215 can be removed to reduce or prevent the surface oxidation of the contact plug 215. Furthermore, by performing plasma processing, the efficiency of removing oxygen can be enhanced over a conventionally performed thermal treatment. Although plasma processing is performed in $NH_3$ gas ambient in the current embodiment, any reduction gas, including, for example, $H_2$ gas, may be used.

Figure 5C:
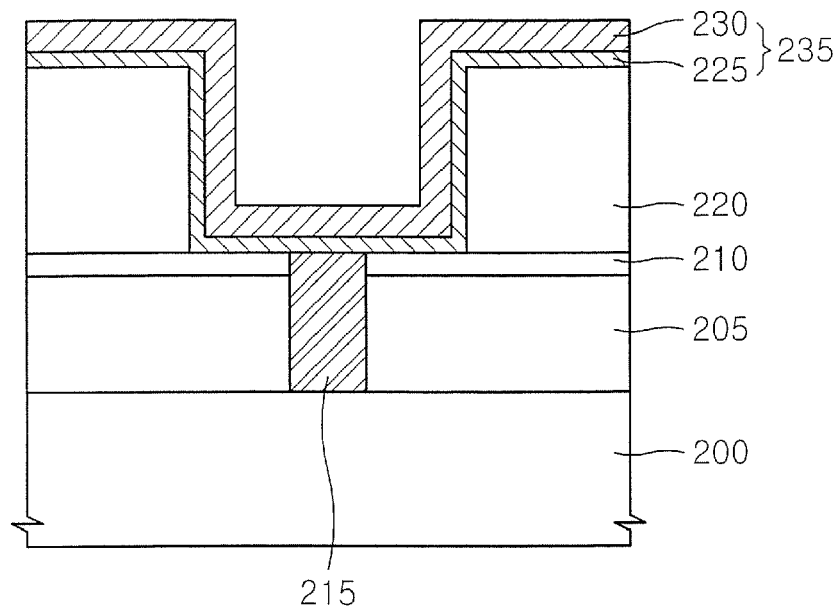
Figure 6B:
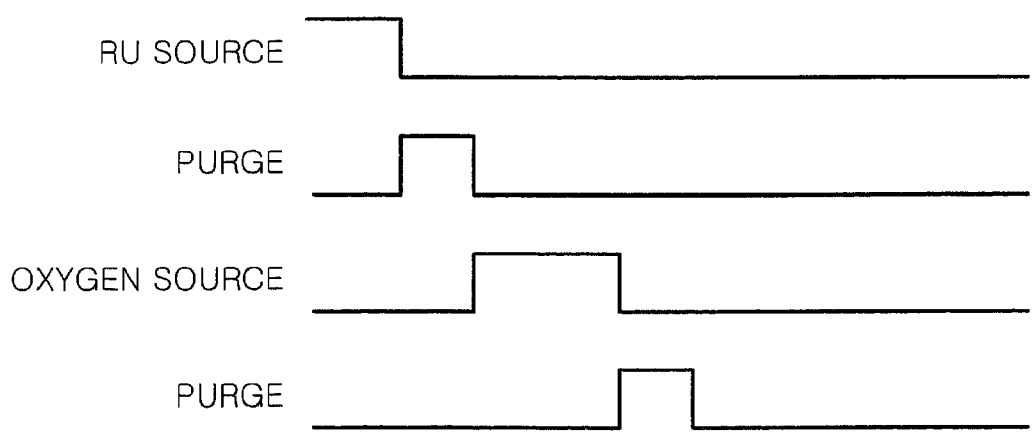
FIG. 6B is a series of timing charts illustrating a deposition cycle of the second Ru thin film shown in FIG. 5C.

After forming the first Ru thin film 225 as described above, a second Ru thin film 230 is formed as shown in FIG. 5C. The second Ru thin film 230 is a main layer of a lower electrode metal layer, and is obtained by repeating a cycle of supplying a Ru source, purging, supplying an oxygen source and purging a plurality of times, as shown in FIG. 6B.

Even if the second Ru thin film 230 includes a substantial amount of oxygen, it does not significantly impact the conductivity characteristic; rather, a stoichiometric ratio of the Ru thin film can be improved. Also, even if the oxygen atoms exist on the interfacial surface of the first Ru thin film 225 and the second Ru thin film 230, the oxygen atoms are bonded to the Ru atoms that constitute the first and second Ru thin films 225 and 230, and thus do not cause a problem in the interfacial bonding. Therefore, plasma processing of $NH_3$ may be omitted when forming the second Ru thin film 230.

When $NH_3$ plasma processing is not performed, the overall processing time may be decreased and the deposition speed of the Ru layer may be improved. That is, Ru atoms have a high bonding affinity with the oxygen atoms rather than other Ru atoms. Accordingly, as the number of oxygen atoms is increased, the absorption rate of the Ru atoms is increased. Thus, if plasma processing of $NH_3$ is not performed when depositing the second Ru thin film 230, the oxygen atoms may be left within the second Ru thin film 230 to increase the deposition speed of Ru.

In embodiments of the present invention, the minimum number of cycles that are necessary to form a coating may be performed to form the first Ru thin film 225. In such a manner, the impact of the plasma processing of $NH_3$ may not have a significant impact on the overall deposition speed.

Figure 5D:
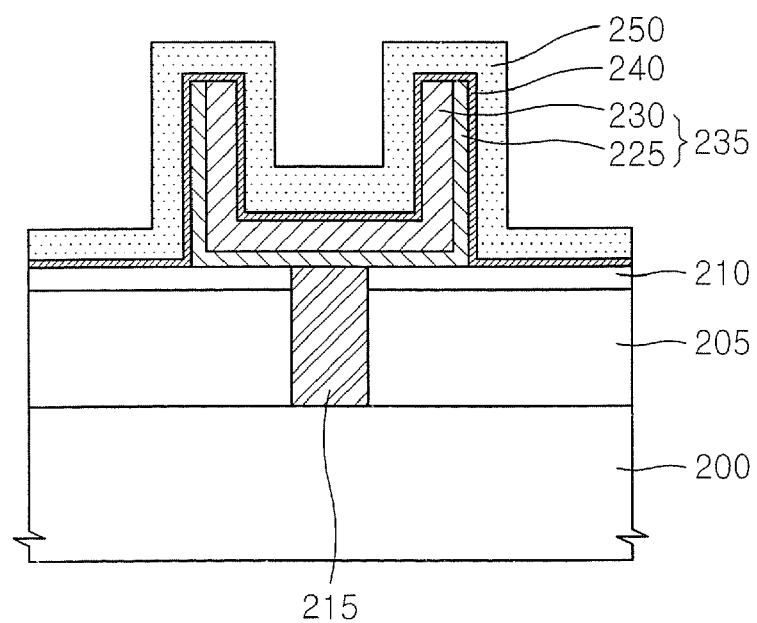

As shown in FIG. 5D, the second and first Ru thin films 230 and 225 may be planarized to expose the mold oxide layer 220, thereby forming a lower electrode 235. After forming a dielectric film 240 on a surface of the lower electrode 235 as is well known in the art, an upper electrode 250 is formed on an upper surface of the dielectric film 240.

Figure 8:
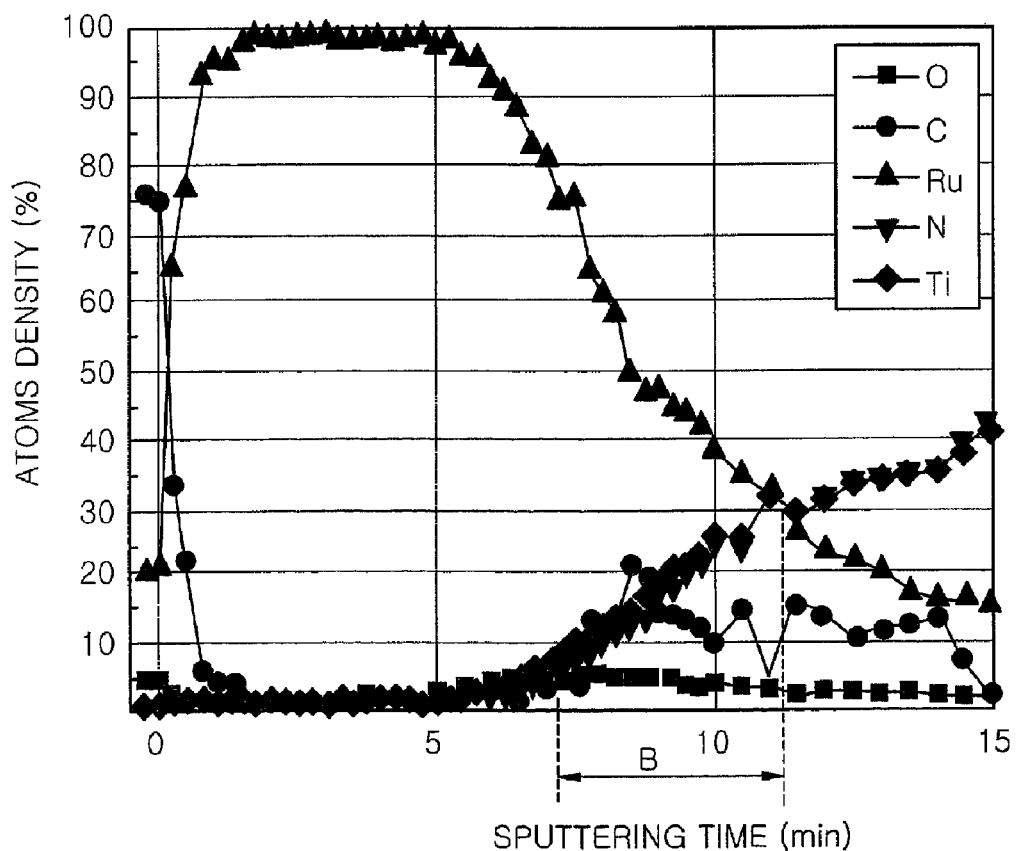
FIG. 8 is a graph illustrating analyzed ingredients of an Ru lower electrode and a TiN contact plug formed according to embodiments of the present invention.

FIG. 8 is a series of graphs illustrating analyzed ingredients of an Ru lower electrode and a TiN contact plug formed according to embodiments of the present invention. The ingredients analysis of the Ru lower electrode and the TiN contact plug was obtained by sputtering the Ru lower electrode and the TiN contact plug. That is, when predetermined ions are directed at the Ru lower electrode 235, the Ru atoms constituting the Ru lower electrode 235 are sputtered on. Therefore, the ingredients of the sputtered atoms are used to analyze the ingredients constituting the lower electrode.

When sputtering is performed for a predetermined time, atoms constituting the TiN contact plug placed on the lower portion of the Ru lower electrode 235, e.g., Ti atoms, are sputtered. A region B in the graph of FIG. 8 where Ru atoms and Ti atoms coexist corresponds to the interfacial surface region of the lower electrode and the contact plug. It can be noted that the distribution of the oxygen atoms is significantly decreased in the interfacial surface region B as compared with the conventional case (refer to FIG. 1).

Figure 9:
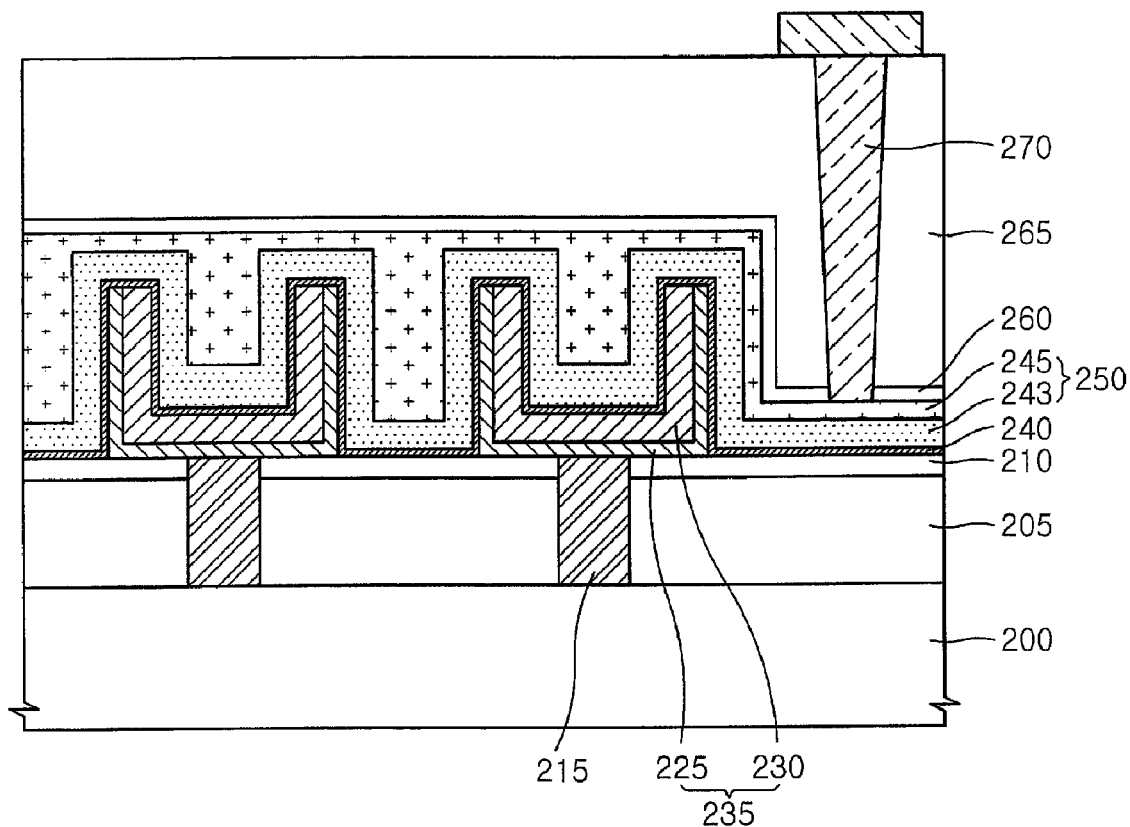
FIG. 9 illustrates methods of fabricating capacitors according to additional embodiments of the present invention.

FIG. 9 illustrates methods of fabricating capacitors according to further embodiments of the present invention. Here, an upper electrode 250 is composed of a third Ru thin film 243 and a fourth Ru thin film 245. In this case, the third Ru thin film 243 that contacts the dielectric film 240 is formed by repeating a cycle of supplying a Ru source, purging, supplying an oxygen source and purging similar to that of the second Ru thin film 225. The third Ru thin film 243 contacts the dielectric film 240, causing no problem even when the oxygen atoms are distributed on the interfacial surface.

The fourth Ru thin film 245 is formed by repeating a cycle of supplying a Ru source, purging, supplying an oxygen source, purging, plasma processing of $NH_3$ and purging, similar to the first Ru thin film 230. The oxygen atoms existing inside and on an upper surface of the fourth Ru thin film 245 formed as above are mostly removed by plasma processing of $NH_3$ as described above. Accordingly, the oxygen atoms distribution on an upper surface of the upper electrode 250 that will contact a metal interconnect 270 is decreased, thereby decreasing a contact resistance between the metal interconnect 270 and the upper electrode 250. Here, a reference numeral 260 denotes a capping layer that covers the upper electrode 250, and 265 denotes an interlayer insulating layer.

Figure 10:
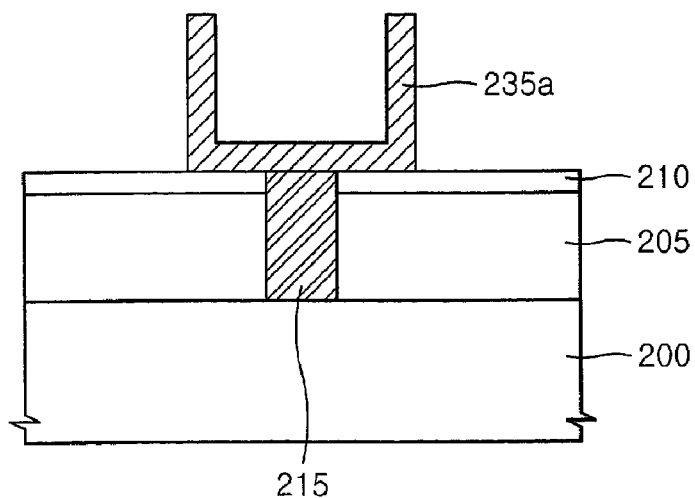
FIG. 10 illustrates methods of fabricating capacitors according to still further embodiments of the present invention.

FIG. 10 illustrates methods of fabricating capacitors according to additional embodiments of the present invention.

Here, a Ru layer constituting a lower electrode 235a is formed by repeating a cycle of supplying a Ru source, purging, supplying an oxygen source, purging, plasma processing of $NH_3$, and purging to remove the oxygen atoms eliminated by plasma processing $NH_3$.

As described above, if $NH_3$ plasma processing is performed for each deposition cycle to form the Ru layer, the oxygen atoms within the Ru layer may be thoroughly removed to more effectively prevent oxidation of the underlying contact plug.

In the above-described embodiments of the present invention, a Ru layer is given as an example as a lower electrode and an upper electrode of a capacitor. However, it will be appreciated that in other embodiments of the present invention, other metals such as, for example, Pt, Pr, Ir, Rh, Os, SRO or Cu obtained by reaction of a metal source and an oxygen source may be used.

Furthermore, although NH$_3$ gas is applied for plasma processing in a reduction gas ambient, gas that can reduce oxygen, e.g., H$_2$ gas, may be applied instead.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a capacitor comprising:
   forming an interlayer insulating layer on a semiconductor substrate;
   forming a contact plug that penetrates the interlayer insulating layer;
   forming a metal layer on the contact plug by performing a deposition cycle that includes at least one cycle of supplying a first metal source, and then purging, and then supplying an oxygen source, and then purging, and then plasma processing in a reduction gas ambient, and then purging;
   removing a portion of the metal layer to form a lower electrode;
   forming a dielectric film on a surface of the lower electrode;
   forming an upper electrode on an upper surface of the dielectric film; and
   forming a metal interconnect in direct contact with the upper electrode;
   wherein the deposition cycle further includes at least one cycle of supplying a second metal source, purging, supplying the oxygen source, and purging, and
   wherein the first metal source and the second metal source consist of the same material,
   wherein forming the upper electrode comprises:
   forming a third metal layer on an upper surface of the dielectric film by repeating a cycle of supplying a metal source, and then purging, and then supplying the oxygen source, and then purging, wherein the cycle of supplying the metal source, and then purging, and then supplying the oxygen source, and then purging that is repeated multiple times to form the third metal layer on the upper surface of the dielectric film does not include any plasma processing in a reduction gas ambient purging; and then
   forming a fourth metal layer on an upper surface of the third metal layer by repeating a cycle of supplying the metal source, and then purging, and then supplying the oxygen source, and then purging, and then plasma processing in a reduction gas ambient and then purging.

2. The method of claim 1, wherein the first and second metal sources are selected from a group consisting of a Ru source, a Pt source, a Pr source, an Ir source, a SRO source and a Cu source.

3. The method of claim 1, wherein the reduction gas comprises NH$_3$ and/or H$_2$ gas.

4. The method of claim 1, the method further comprising forming a mold oxide layer that includes a lower electrode region that exposes the contact plug before forming the metal layer.

5. The method of claim 4, wherein forming the lower electrode comprises:
   chemical mechanical polishing the metal layer to expose a surface of the mold oxide layer; and
   removing the mold oxide layer.

6. The method of claim 1, wherein the at least one cycle of supplying a second metal source, purging, supplying the oxygen source, and purging that is included in the deposition cycle includes multiple such cycles, and those multiple cycles do not include any plasma processing in a reduction gas ambient.

7. The method of claim 1, wherein the cycle that is repeated to form the third metal layer differs from the cycle that is repeated to form the fourth metal layer.

8. A method of fabricating a capacitor comprising:
   forming an interlayer insulating layer on a semiconductor substrate;
   forming a contact plug that penetrates the interlayer insulating layer;
   forming a first metal layer on the contact plug by performing a first deposition process that includes at least one cycle of supplying a first metal source, and then purging, and then supplying an oxygen source, and then purging, and then plasma processing in a reduction gas ambient, and then purging;
   forming a second metal layer on the first metal layer by a second deposition process that includes multiple cycles of supplying a second metal source that consists of the same material as the first metal source, purging, supplying the oxygen source, and purging where at least some of the multiple cycles in the second deposition process do not include any plasma processing in a reduction gas ambient;
   removing portions of the first and second metal layers to form a lower electrode;
   forming a dielectric film on a surface of the lower electrode;
   forming an upper electrode on an upper surface of the dielectric film by forming a third metal layer on an upper surface of the dielectric film by a third deposition process that includes multiple cycles of supplying a third metal source, and then purging, and then supplying an oxygen source, and then purging where at least some of the multiple cycles in the third deposition process do not include any plasma processing in a reduction gas ambient, and then forming a fourth metal layer on an upper surface of the third metal layer by a fourth deposition process that includes at least one cycle of supplying the third metal source, and then purging, and then supplying the oxygen source, and then purging, and then plasma processing in a reduction gas ambient and then purging; and
   forming a metal interconnect in direct contact with the upper electrode.

9. The method of claim 8, wherein the second metal layer is thicker than the first metal layer.

10. The method of claim 9, wherein the first metal layer has a thickness that is less than 1/3 of the total thickness of the combination of the first and second metal layers.

11. The method of claim 8, wherein an upper surface of the contact plug that contacts the first metal layer is formed of TiN.

* * * * *